United States Patent [19]
Porter

[11] Patent Number: 5,565,794
[45] Date of Patent: Oct. 15, 1996

[54] VOLTAGE RANGE TOLERANT CMOS OUTPUT BUFFER WITH REDUCED INPUT CAPACITANCE

[75] Inventor: John D. Porter, Austin, Tex.

[73] Assignee: Advanced Micro Devices, Inc., Sunnyvale, Calif.

[21] Appl. No.: 494,271

[22] Filed: Jun. 23, 1995

[51] Int. Cl.$^6$ .................. H03K 19/0185; H03K 19/0948
[52] U.S. Cl. .................. 326/81; 326/58; 326/86; 326/120
[58] Field of Search .................. 326/57–58, 80–81, 326/83, 86–87, 17, 30, 112, 117, 119, 120, 121

[56] References Cited

U.S. PATENT DOCUMENTS

| | | | |
|---|---|---|---|
| 5,057,715 | 10/1991 | Larsen et al. | 326/83 |
| 5,150,186 | 9/1992 | Pinney et al. | 326/112 |
| 5,387,826 | 2/1995 | Shay et al. | 326/83 |

*Primary Examiner*—Edward P. Westin
*Assistant Examiner*—Jon Santamauro
*Attorney, Agent, or Firm*—Skjerven, Morrill, MacPherson, Franklin & Friel

[57] ABSTRACT

A tri-state CMOS output buffer is provided which exhibits a relatively low input capacitance and tolerance to a range of operating voltages. The output buffer includes a PUP input, a PD input and an output. The output buffer includes a source follower circuit coupled to the PUP input such that the output of the source follower generally follows transitions in the PUP input signal. The source follower output is the buffer output. A pull-down transistor is coupled between the buffer output and ground to pull-down the output voltage when the PD signal goes high. A pull-up transistor and an isolation transistor are coupled in series to form a series coupled circuit. This series-coupled circuit is coupled in parallel with the source follower. The pull-up transistor pulls up the voltage on the buffer output when the PUP input signal goes high. The isolation transistor is switchable to an off state to isolate a parasitic diode associated with the pull-up transistor. A control circuit is coupled to the buffer output and the PUP input to monitor the buffer output and the PUP input to turn off the isolation transistor when the buffer output is in a tri-state condition and the buffer output is driven high by an external device. Otherwise, the control circuit causes the isolation transistor to remain on. In this manner, isolation transistor switching is significantly reduced and the capacitive load presented to the PUP input signal is substantially lowered.

16 Claims, 4 Drawing Sheets

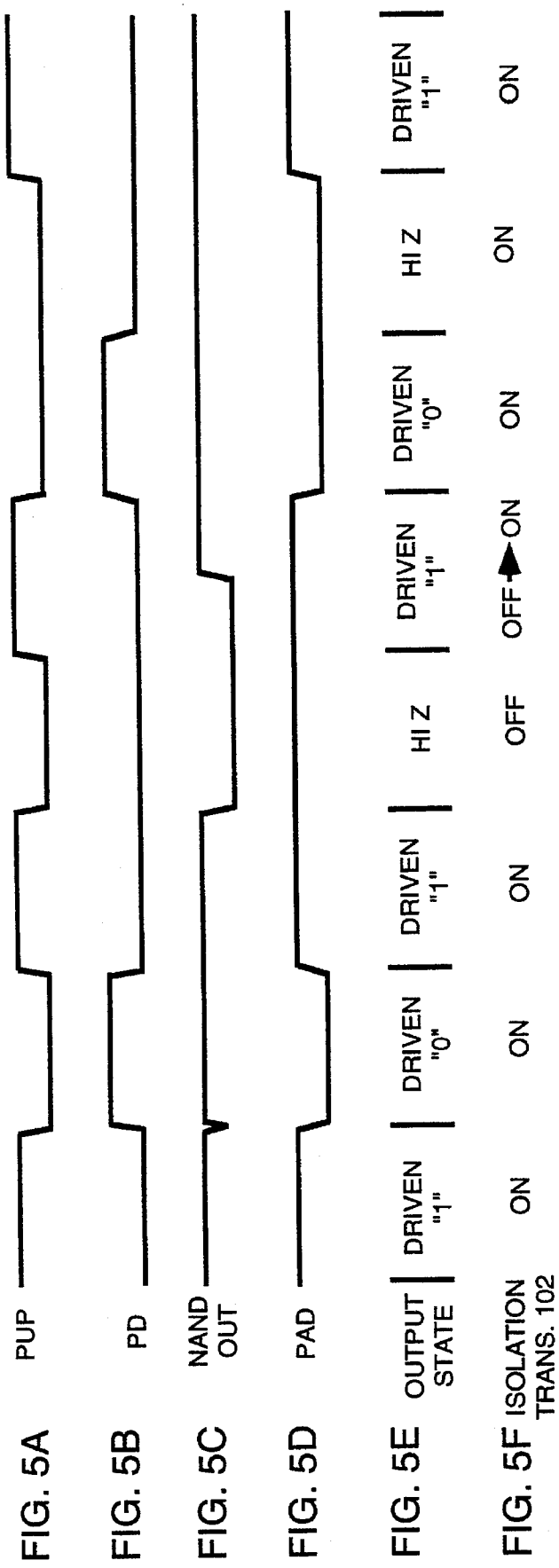

VOLTAGE RANGE TOLERANT CMOS OUTPUT BUFFER WITH REDUCED INPUT CAPACITANCE

BACKGROUND OF THE INVENTION

1. Field of the Invention

The present invention relates to output buffers and, more particularly, to CMOS output buffers which are tolerant to voltage variation.

2. Description of Related Art

The trend in modern CMOS transistor circuit design is toward lower operating voltages to achieve reduced power consumption. For several years, 5 volt CMOS transistors were very common and circuits were designed to operate at this voltage level. More recently, 3 volt CMOS transistors have become more common. However, since 5 volt circuitry is still very commonplace, it is desirable that a CMOS component such as an output buffer be able to operate at 3 volts and yet tolerate a 5 volt operating voltage without damage or significant performance degradation. In other words, a voltage range tolerant output buffer is needed for applications where 3 volt devices may be used in a 5 volt environment.

One type of conventional tri-state CMOS output buffer is depicted in FIG. 1A as buffer 10. Depending on the state of the input signals provided to buffer 10, the output of buffer can exhibit a 0, a 1, or a high impedance (HI Z) State. When a tri-state output buffer such as buffer 10 exhibits a high impedance state, it is said to be exhibiting the "tri-state condition". Buffer 10 includes CMOS transistors M1, M2, M3 and M4, the interconnection of which is later described in more detail. Buffer 10 includes two inputs, designated PUP and PD, to which quasi-complementary data signals having the same names as the respective inputs are provided. PUP refers to a pull-up signal and PD refers to a pull-down signal. Except for those times when the PUP signal and the PD signal are both low, the PUP signal is high when the PD signal is lowland vice versa. Unlike true complementary input signals, it is possible for both the PUP and PD signals to be low at the same time which causes the output of the buffer to exhibit the high impedance (HI Z) state. FIG. 1B is a truth table illustrating the above described combinations of states for output buffer 10.

Buffer 10 includes an output pad 15 as shown. In an ideal output buffer, when PUP is high, output pad 15 is pulled up completely to the rail voltage, $V_{CC}$.

Conversely, when PD is high, output pad 15 would ideally be completely pulled down to the $V_{SS}$ or ground voltage. Also, in the ideal case, if both PUP and PD are low, buffer 10 is tri-stated such that output pad 15 is permitted to float in a high impedance or "hi-Z" state. It is very desirable that the output buffer exhibit a low input capacitance to permit the buffer to operate at high speed. Unfortunately, the conventional output buffer 10 depicted in FIG. 1A exhibits a relatively high input capacitance and thus low speed performance.

In buffer 10 transistor M1 is a PMOS enhancement mode device and transistor M2 is an NMOS depletion mode device. Transistor M3 is a NMOS enhancement mode device and transistor M4 is an NMOS enhancement mode device. Transistor M4 acts as a pull-down device for buffer 10. In other words, when a high PD signal is supplied to buffer 10, transistor M1 pulls down the source of M2 which pulls down output pad 15 to ground. Transistor M3 is configured as a source follower, the gate of which is coupled to the PUP input and the source of which is coupled to output pad 15. The threshold voltage of source follower M3 is defined to be VT. A characteristic of a source follower such as transistor M3 is that the voltage on the source follows the voltage on the gate minus a differential of approximately VT. In other words, when you pull up on the gate of the source follower, the source voltage follows the gate voltage up. However, once the source voltage is high, the assistance of another active device (here, pull-down transistor M4) is typically required to pull the source low again as described above.

In buffer 10, source follower M3 and pull-down transistor M4 act together to attempt to cause the output pad 15 voltage (the source of transistor M3) to follow the PUP input signal which is presented to the gate of source follower M3. In actual practice, the source of N channel source follower M3 is pulled down to ground by transistor M4 when PD is high better than it is pulled up to $V_{CC}$ when PD is low and PUP is high. In other words if the PUP signal goes low and the PD signal goes high to turn pull-down transistor M4 on, then the source of source follower M3 also goes low or nearly to ground voltage. Unfortunately, however, when the PUP signal goes high to $V_{CC}$, the source of source follower M3 does not pull up completely to $V_{CC}$, but rather only pulls up to approximately $V_{CC}$ minus VT.

Series coupled transistors M1 and M2 are employed in buffer 10 to provide additional current paths to permit the buffer output voltage at output pad 15 to be pulled up nearly all the way to $V_{CC}$ when the PUP input goes high to $V_{CC}$. More particularly, transistor M1 provides the extra pull-up capability while transistor M2 provides a high voltage (5 volt) tolerance capability. To illustrate this point, consider FIG. 2 which shows an output buffer 20. Output buffer 20 of FIG. 2 is similar to output buffer 10 of FIG. 1A, except that transistor M2 is not present in output buffer 20. An inverter 25 is coupled between the PUP input and the gate of transistor M1 in both buffers 10 and 20.

Without transistor M2 present, output buffer 20 becomes a "not 5 volt tolerant" output buffer. In output buffer 20, transistor M1 provides additional current to pull output pad 15 to nearly $V_{CC}$ when PUP goes high. In this manner, transistor M1 assists source follower M3 in pulling pull output pad 15 up. However, while output buffer 20 is capable of having its output pad 15 being pulled all the way up to $V_{CC}$, output buffer 20 is not 5 volt tolerant due to the lack of transistor M2. More particularly, buffer 20 of FIG. 2 is not 5 volt tolerant because a parasitic diode 30 is effectively formed between the drain of transistor M1 and the n well in which the drain of transistor Mi is formed. For convenience in illustration a box with a dashed line is drawn around diode 30 to indicate that, while drawn separately from transistor M1, diode 30 is actually a part of transistor M1.

FIG. 3 is a physical representation of pull-up transistor M1 which shows parasitic diode 30 with more clarity. Pull-up transistor M1 includes a substrate 35 in which an n-well 40 is situated. A p+ source 45 (designated S) and a p+ drain 50 (designated D) are situated in spaced-apart relationship at the upper surface of n well 40. A gate region 55 is situated between p+ source 45 and p+ drain 50 as shown in FIG. 3. The p+ junction between p+ drain 50 and n well 40 effectively forms a parasitic diode which is represented schematically as diode 30. If a user applies 5 volts to output pad 15 of transistor M1 in output buffer 20, parasitic diode 30 will be turned on and conduct current. If the buffer is only a 3.3 volt component and 5 volts is applied to output pad 15, this causes a drop 1.7 volts across the diode. A large amount of current would thus be conducted by the diode in buffer 20 if the output pad is subjected to 5 volts instead of 3 volts, Thus, the presence of parasitic diode 30 connected to output pad 15 in buffer 20 causes buffer 20 to be "not 5 volt tolerant".

To make the output buffer "5 volt tolerant", a depletion mode NMOS transistor M2 is coupled in series with transistor M1 as in output buffer 10 of FIG. 1A. In this manner, transistor M2 acts as an isolation transistor which effectively decouples parasitic diode 30 from output pad 15 such that should the user or circuit designer apply 5 volts to output pad 15, diode 30 is not turned on. If an enhancement mode NMOS transistor were used for isolation transistor M2, such a transistor would hinder the ability of transistor M1 to pull output pad 15 all the way up to $V_{CC}$. For this reason, a depletion mode NMOS transistor is used as transistor M2. Unfortunately, another problem is created by placing a depletion mode NMOS transistor M2 in series with transistor M1. Depletion mode NMOS transistors exhibit very poor sub-threshold current characteristics and, in fact, have a negative threshold voltage. In other words, depletion mode NMOS transistors do not turn off very well and are said to exhibit current leakage. The leakage path through transistor M2 and parasitic diode 30 typically only occurs if the voltage applied to pad 15 goes above $V_{CC}$. However, depletion mode NMOS transistor M2 will not turn off unless a sufficiently negative voltage is applied between the gate and source of transistor M2. Thus, the gate of such a transistor must generally be pulled all the way to ground to assure that the transistor is completely off and does not leak.

FIG. 1C depicts the driven state output level at pad 15 and corresponding states of isolation transistor M2. Isolation transistor M2 is off when the driven output level at pad 15 is a 0 or low. Isolation transistor M2 is also off when the driven output level at pad 15 is in the "HI Z" state. However, isolation transistor M2 is on when the driven output level at pad 15 is 1 or high state. It is thus seen that isolation transistor M2 switches state with each transition of the PUP input signal.

Depletion mode NMOS transistor M2 is typically a rather wide device. For example, the channel width of transistor M2 is approximately 320 microns wide in one version. When the gate of such a wide device as NMOS transistor M2 is coupled to the PUP input, a significant amount of capacitance is provided to the PUP input. Unfortunately, this capacitive loading of the PUP input significantly loads down the PUP signal which is a data signal provided to the buffer. The capacitive effects of transistor M2 on this PUP input data signal are felt as the PUP signal supplied to transistor M2 is gated on and off to turn transistor M2 on and off. In other words, the capacitance exhibited by transistor M2 on the PUP input signal is encountered each time transistor M2 changes state in step with the transitions of the PUP input signal. This capacitive loading of the PUP input causes the propagation delay of data through output buffer 10 to be undesirably increased. For example, the propagation delay of a conventional output buffer such as shown in FIG. 1A is approximately 1.7 nsec. An output buffer which would provide 5 volt tolerance and yet exhibit minimal capacitive loading of the input signal would be very desirable.

SUMMARY OF THE INVENTION

Accordingly, a CMOS output buffer is provided which exhibits reduced input capacitance and which is also voltage range tolerant. The output pad of the buffer is capable of being pulled up substantially all the way to $V_{CC}$ and all the way down to ground as the input signal switches. The output buffer accomplishes this switching without substantial leakage.

In accordance with one embodiment of the present invention, a tri-state output buffer is provided which includes a PUP input, a PD input and an output. The PUP input receives a PUP input signal. The PD input receives a PD input signal. The buffer includes a source follower circuit coupled to the PUP input and the output such that the output exhibits an output voltage which generally follows the PUP input signal. The buffer also includes a pull-down transistor, coupled to the PD input and the output, to pull-down the output voltage when the PD input signal goes high and the PUP voltage goes low. The buffer further includes a series-coupled circuit including a pull-up transistor coupled in series with an isolation transistor. The series-coupled circuit is coupled in parallel with them source follower circuit. The pull-up transistor is coupled to the PUP input to pull up the output voltage when the PUP input signal goes high. The pull-up transistor includes an undesired parasitic diode. The isolation transistor is switchable to an off state to provide isolation; of the parasitic diode in the pull-up transistor. The buffer also includes a control circuit, coupled to the output and the PUP input and to the isolation transistor, for monitoring the voltage at the output and the PUP input to turn off the isolation transistor when the output is in a tri-state condition and the output is driven high by an external device. The control circuit otherwise permits the isolation transistor to remain on such that input capacitance at the PUP input is effectively reduced.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIGS. 5A–5F are timing diagrams which show the timing relationships of a PUP input signal, a PD input signal, a NAND output signal (NANDOUT), a driven output signal (PAD), a buffer output pad state, and a state of an isolation transistor, respectively.

DETAILED DESCRIPTION OF THE INVENTION

Figures 4A, 4B, 4C:
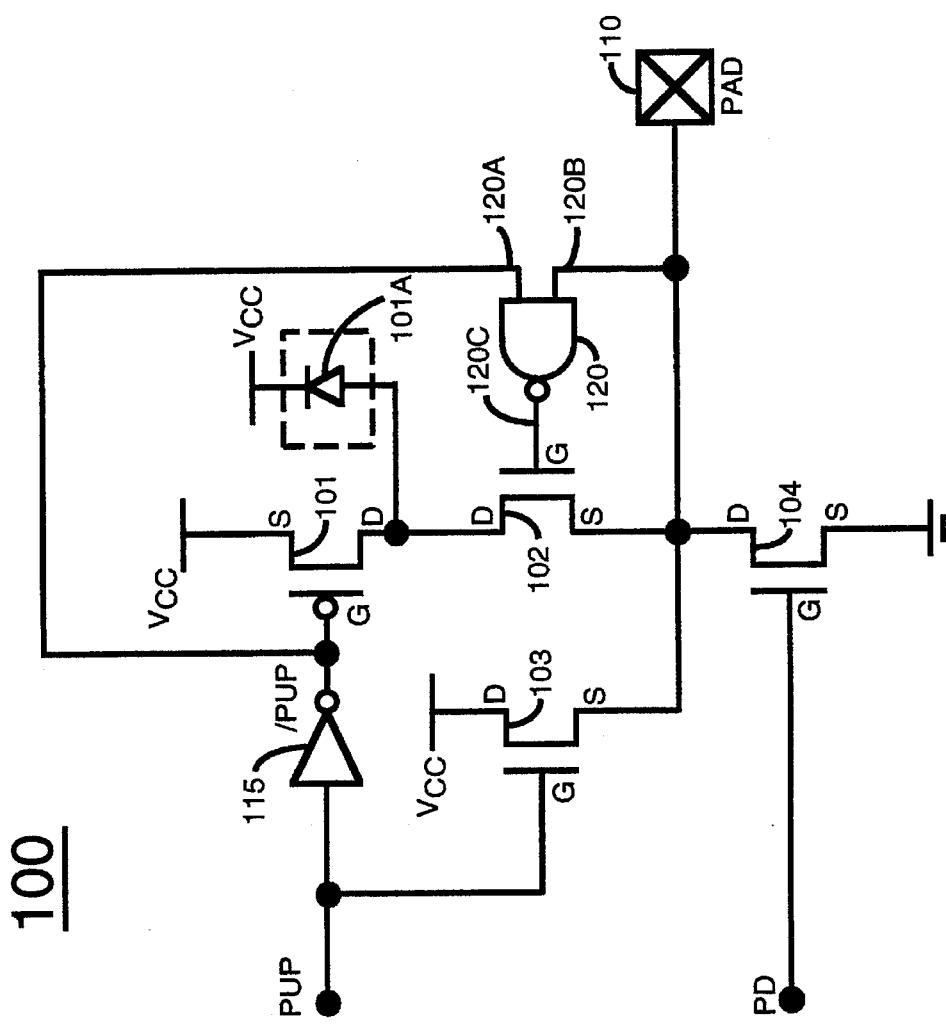
FIG. 4A is a schematic diagram of the disclosed voltage range tolerant output buffer.
FIG. 4B is a truth table for the output buffer of FIG. 4A showing its input and output states.
FIG. 4C is a chart depicting the output state of the output buffer of FIG. 4A and the corresponding possible states of the isolation transistor thereof.

FIG. 4A is a schematic diagram of CMOS output buffer 100. Output buffer 100 includes PMOS transistor 101, depletion mode NMOS transistor 102, NMOS transistor 103 and NMOS transistor 104. The drain, gate, and source of these transistors are labelled D, G, and S, respectively. Output buffer 100 includes inputs PUP and PD to which the PUP data input signal and the PD data input signal are supplied, respectively. Buffer 100 also includes an output pad 110 to which the buffer output signal, PAD, is provided. FIG. 4B is a truth table which depicts the various input and output state combinations of output buffer 100. From FIG. 4B it is seen that output buffer 100 operates as a tri-state device.

Transistor 103 is configured as a source follower as shown in FIG. 4A. More particularly, the gate of source follower transistor 103 is coupled to the PUP input and the source is coupled to output pad 110. The drain of source follower transistor 103 is coupled to $V_{CC}$. In this manner, the voltage on the source of transistor 103 and the output pad 110 coupled thereto generally follows the PUP signal supplied to the gate of transistor 103.

Transistor 104 is configured as a pull-down transistor which is coupled between pad 110 and ground as shown. More specifically, the drain of transistor 104 is coupled to output pad 110 and the source of source follower transistor 103. The source of pull-down transistor 104 is coupled to ground and the gate of pull-down transistor 104 is coupled to the PD input. In this manner, when the PD signal goes high, it is assured that output pad 110 is pulled to ground and that the buffer output signal, PAD, goes low.

Transistor 101 is connected as a pull-up transistor to pull output pad 110 closer to $V_{CC}$ than source follower 103 can by itself when the PUP input signal goes high to $V_{CC}$. Pull-up transistor 101 is a PMOS transistor, the source of which is coupled to $V_{CC}$ and the drain of which is coupled to output pad 110 via series-coupled transistor 102. The gate of pull-up transistor 101 is coupled via inverter 115 to the PUP input. The signal produced at the output of inverter 115 is thus the /PUP signal. Pull-up transistor 101 exhibits a parasitic diode 101A similar to the parasitic diode 30 which was associated with transistor M1 that was discussed earlier with respect to the output buffers of FIG. 1A and FIG. 2. While parasitic diode 101A is actually formed between the p+ drain and the n well of transistor 101, it is shown as a separate part in FIG. 4A for illustration purposes.

Transistor 102 is series-coupled between the drain of pull-up transistor 101 and output pad 110. Transistor 102 permits output buffer 100 to be 5 volt tolerant by acting as an isolation transistor which isolates the parasitic diode 101A of transistor 101 from output pad 110. In this manner, parasitic diode 101A is prevented from becoming forward biased and turned on when the voltage applied to output pad 110 by an external device goes above the 3 volt level up to the 5 volt level.

To control when transistor 102 is turned off to isolate parasitic diode 101A, a NAND gate 120 is coupled to isolation transistor 102 as shown in FIG. 4A. More particularly, NAND gate inputs 120A and 120B are respectively coupled to the gate of pull-up transistor 101 and output pad 110. The output 120C of NAND gate 120 is coupled to the gate of isolation transistor 102.

A unique approach is employed to control when isolation transistor 102 is gated on and gated off in output buffer 100. The manner in which this is accomplished is now discussed in more detail. NAND gate 120 acts to monitor the voltage on output pad 110. When isolation transistor 102 is turned off, it is in an isolation mode which effectively decouples or isolates parasitic diode 101A from output pad 110. To turn transistor 102 off into its isolation mode, the gate of transistor 102 is pulled low in this particular embodiment. More particularly, to assure that transistor 102 is fully off in the isolation mode, the gate of transistor 102 is pulled to ground by NAND gate output 120C. NAND gate output 120C goes low when both NAND inputs 120A and 120B go high. Both NAND gate inputs are high if the voltage at pad output 110 is high (a condition which could turn on parasitic diode 101A) and the gate of transistor 101 is high (i.e. PUP is low).

The chart of FIG. 4C depicts the output state of output pad 110 (0, 1, or HI Z) as driven by the buffer itself (the "self driven" output state) and the corresponding state of isolation transistor 102. This "self driven" output state is the state which the output of the buffer attempts to assume based upon the particular input data provided to inputs PUP and PD. The "self driven" output state is distinguished from the "externally driven" output state discussed below. It is noted that while output pad 110 of output buffer 100 generally assumes an output state of 0, 1 or HI Z, it is possible for the output pad to exhibit a high or 1 when the buffer is tri-stated (HI Z) if an external device (not shown) coupled to output pad 110 impresses a 1 or logical high on the output pad. In this particular scenario, the "externally driven" output state of output pad 110 would be high or 1 while the "self driven" output state of the buffer is HI Z.

As seen in the chart of FIG. 4C, when the "self driven" output state at pad 110 is either a 0 or 1, then isolation transistor 102 is on. However, when the "self driven" output state of this tri-state output buffer is the "HI Z" state, then isolation transistor 102 is switched off to the isolation mode only if the output pad voltage is a 1 or logical high (i.e. more than 3 volts). Otherwise, isolation transistor 102 remains on if the pad voltage is 0 when the "self driven" output state is the "HI Z" state.

In more detail, when PUP is high (a logical 1) and PD is low (a logical 0), the "self driven" output state at output pad 110 is high. The PUP signal is inverted by inverter 115 so that NAND gate input 120A is low, thus causing NAND gate output 120C to go high such that isolation transistor 102 remains on (not in the isolation mode). It is again noted that for isolation transistor 102 to be switched off into the isolation mode, both NAND gate inputs must go high in this particular embodiment. In the scenario where PUP is low and PD is high, the "self driven" output state at output pad 110 is low. The isolation transistor 102 again remains turned on (not in the isolation mode) in this situation because the high PD turns pull down transistor 104 on. This action pulls the output pad 110 and NAND gate input 120B low. NAND gate output 120C remains high such that isolation transistor 102 remains on and does not switch.

In the operational scenario where both PUP and PD are low, then the "self-driven" output state at output pad 110 is the HI Z state. In this case, isolation transistor 102 remains on (not in the isolation mode) if no external device (not shown) coupled to output pad 115 drives output pad high. However, if an external device drives output pad 110 high when buffer 100 is in the HI Z state, then both NAND gate input 120A and 120B will be high at the same time such that isolation transistor 102 is turned off into the isolation mode.

Figure 1:
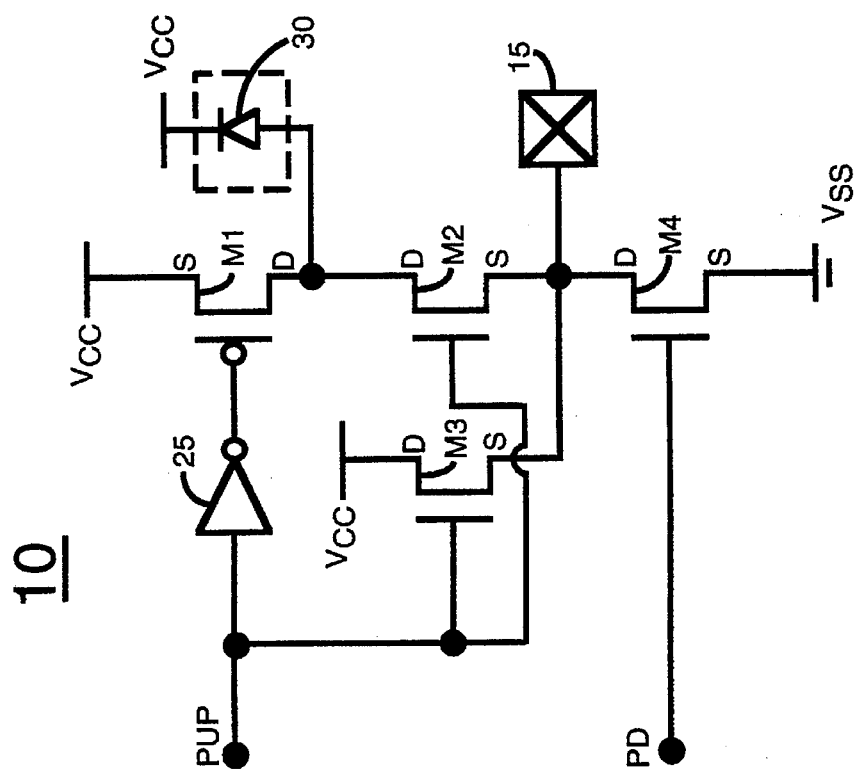
FIG. 1A is a schematic diagram of a conventional "5 volt tolerant" CMOS output buffer.
FIG. 1B is a truth table for the CMOS output buffer of FIG. 1A showing its input and output states.
FIG. 1C is a chart depicting the drive output level of the output buffer of FIG. 1A and the corresponding possible states of the isolation transistor thereof.
Figure 2:
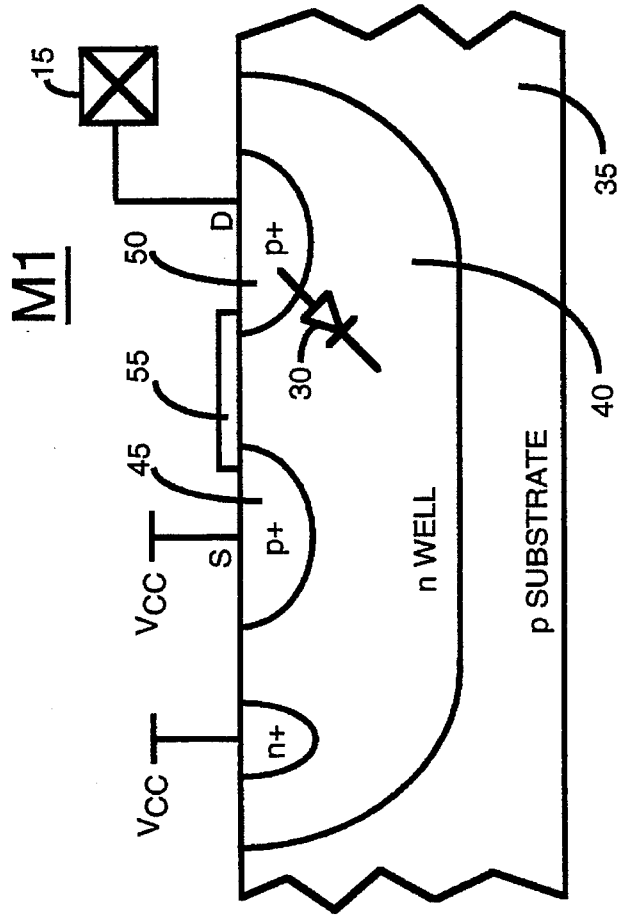
FIG. 2 is a schematic diagram of a conventional "non 5 volt tolerant" CMOS output buffer.
Figure 3:
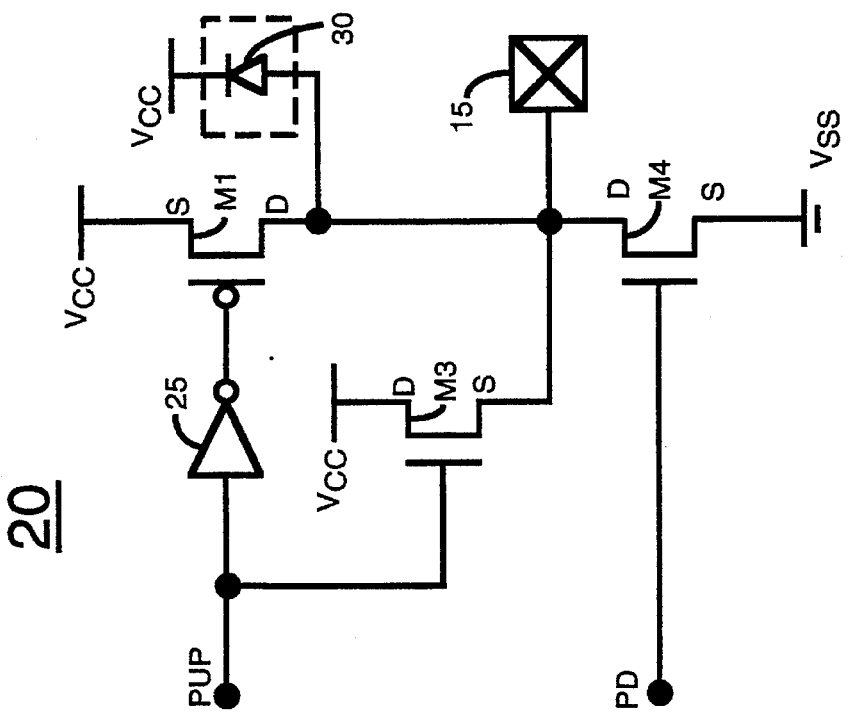
FIG. 3 is a simplified representation of a physical cross-section of transistor M1 of the output buffers of FIGS. 1A and 2.

Since isolation transistor 102 is not being switched on and off with each transition of the PUP data input signal, the effective input capacitance exhibited by isolation transistor 102 on the PUP input signal is significantly reduced as compared to the conventional output buffer 10 of FIG. 1A. In other words, a reduction in the amount of switching on and off of isolation transistor 102 corresponds to a reduction of the effective input capacitance exhibited by output buffer 100 of FIG. 2. It is again noted that isolation transistor 102 is turned off or switched off only in the "HI Z" output state and then only when the output pad 110 is driven high by another device (not shown) which is coupled to output pad 110. Otherwise, isolation transistor 102 can remain unswitched in the on state. With such decreased switching of isolation transistor 102, the effective input capacitance exhibited by output buffer 100 to the PUP signal is substantially reduced.

The buffer output signal, PAD, may be high for two reasons when buffer 100 is tri-stated, i.e. when buffer 100 is in the HI Z state. First, the buffer output signal can be high if buffer 100 was previously "self-driven" high by the buffer responding to a high PUP input signal. Second, the buffer output signal can also be high even though the buffer is in the HI Z state if it is "externally-driven" high by an external device coupled to buffer output 110. If buffer 100 is in the HI Z state, isolation transistor 102 is turned off when buffer output 110 goes high for either of these two reasons. Parasitic diode 101A is thus isolated from buffer output 110 during those times when the buffer is tri-stated and the buffer output is externally-driven high by another device.

In this particular embodiment, NAND gate 120 is physically relatively small compared with isolation transistor 102. For example, NAND gate 120 exhibits a channel width of approximately 10 microns in this embodiment while the channel width of transistor 102 is approximately 320 microns. Coupling such a small NAND gate 120 to the output of inverter 115 in this manner does not significantly load down the PUP input of output buffer 100.

FIG. 5A–5F are timing diagrams which show the timing relationships of the PUP input signal, the PD input signal, the NAND gate output 120C signal (NANDOUT), the driven output signal (PAD), the state of buffer output pad, and the state of isolation transistor M2, respectively.

The foregoing has described a voltage range tolerant CMOS output buffer which advantageously exhibits reduced input capacitance and therefore increased speed. The propagation delay through CMOS output buffer 100 is approximately 1.4 nsec. Such a voltage tolerant output buffer with reduced input capacitance permits greater flexibility in digital circuit design.

While only certain preferred features of the invention have been shown by way of illustration, many modifications and changes will occur. It is, therefore, to be understood that the present claims are intended to cover all such modifications and changes which fall within the true spirit of the invention.

I claim:

1. A tri-state output buffer comprising:

a PUP input, a PD input and an output, the PUP input receiving a PUP input signal, the PD input receiving a PD input signal;

a source follower circuit coupled to the PUP input and the output such that the output exhibits an output voltage which generally follows the PUP input signal;

a pull-down transistor coupled to the PD input and the output to pull-down the output voltage when the PD input signal goes high and the PUP signal goes low;

a series-coupled circuit including a pull-up transistor coupled in series with an isolation transistor, the series-coupled circuit being coupled in parallel with the source follower circuit, the pull-up transistor being coupled to the PUP input to pull up the output voltage when the PUP input signal goes high, the pull-up transistor including a parasitic diode, the isolation transistor being a depletion mode NMOS transistor which is switchable to an off state to provide isolation of the parasitic diode from the output; and a control circuit, coupled to the output and the PUP input and to the isolation transistor, for monitoring the output voltage and the PUP input voltage and for controlling the isolation transistor to turn off the isolation transistor when the output is in a tri-state condition and the output is driven high, the control circuit otherwise permitting the isolation transistor to remain on, whereby input capacitance at the PUP input is effectively reduced.

2. The tri-state output buffer of claim 1 wherein the control circuit is a NAND gate having a first input terminal coupled to the PUP input, a second input terminal coupled to the output and an output terminal coupled to a control terminal of the isolation transistor.

3. The tri-state output buffer of claim 1 further comprising an inverter coupled between the PUP input and the control circuit.

4. The tri-state output buffer of claim 1 wherein the pull-up transistor comprises an enhancement mode PMOS transistor.

5. The tri-state output buffer of claim 1 wherein the source follower circuit comprises an enhancement mode NMOS transistor.

6. The tri-state output buffer of claim 1 wherein the pull-down transistor comprises an enhancement mode NMOS transistor.

7. A tri-state output buffer comprising:

a PUP input, a PD input and a buffer output, the PUP input receiving a PUP input signal, the PD input receiving a PD input signal;

an inverter coupled to the PUP input to provide a /PUP signal;

a source follower circuit coupled to the PUP input and the buffer output such that the buffer output exhibits a buffer output voltage which generally follows the PUP input signal;

a pull-down transistor coupled to the PD input and the buffer output to pull-down the buffer output voltage when the PD input signal goes high and the PUP signal goes low;

a series-coupled circuit including a pull-up transistor coupled in series with an isolation transistor, the isolation transistor including a gate, the series-coupled circuit being coupled in parallel with the source follower circuit, the pull-up transistor being coupled to the inverter to receive the /PUP signal and to pull up the buffer output voltage when the PUP input signal goes high, the pull-up transistor including a parasitic diode, the isolation transistor being a depletion mode NMOS transistor which is switchable to an off state to provide isolation of the parasitic diode from the buffer output; and a NAND gate including a first NAND input, a second NAND input and a NAND output, the first NAND input being coupled to the inverter to receive the PUP signal, the second NAND input being coupled to the buffer output, the NAND output being coupled to the gate of the isolation transistor, the NAND gate monitoring the buffer output voltage and the /PUP signal and for controlling the isolation transistor to turn off the isolation transistor when the buffer output is in a tri-state condition and the buffer output is driven high, the NAND gate otherwise permitting the isolation transistor to remain on, whereby input capacitance at the PUP input is effectively reduced.

8. The tri-state output buffer of claim 7 wherein the pull-up transistor comprises an enhancement mode PMOS transistor.

9. The tri-state output buffer of claim 7 wherein the source follower circuit comprises an enhancement mode NMOS transistor.

10. The tri-state output buffer of claim 7 wherein the pull-down transistor comprises an enhancement mode NMOS transistor.

11. A tristate output buffer comprising:
- a pullup PMOS transistor having a source terminal coupled to a power supply line, a drain terminal and a gate terminal coupled to a pullup input signal line;
- an isolation NMOS depletion mode transistor having a source terminal coupled to an output pad, a drain terminal coupled to the drain terminal of the pullup PMOS transistor and a gate terminal;
- a pulldown NMOS transistor having a source terminal coupled to a reference line, a drain terminal coupled to the source terminal of the isolation NMOS transistor and the output pad, and a gate terminal coupled to a pulldown input signal line;
- a source follower NMOS transistor having a source terminal coupled to the output pad, a drain terminal coupled to the power supply line and a gate terminal coupled to the pullup input signal line;
- a parasitic diode inherently formed in the tristate output buffer; and
- a control circuit having a first input terminal coupled to the pullup input signal line, a second input terminal coupled to the output pad and an output terminal coupled to the gate terminal of the isolation NMOS depletion mode transistor, the control circuit for switching the isolation NMOS depletion mode transistor so that the output terminal is isolated from the parasitic diode.

12. The tristate output buffer according to claim 11 wherein the control circuit is a NAND gate.

13. The tristate output buffer according to claim 11 further comprising an inverter coupled between the pullup input signal line and the control circuit.

14. The tristate output buffer according to claim 11 wherein the pullup PMOS transistor is an enhancement mode PMOS transistor.

15. The tristate output buffer according to claim 11 wherein the source follower NMOS transistor is an enhancement mode NMOS transistor.

16. The tristate output buffer according to claim 11 wherein the pulldown NMOS transistor is an enhancement mode NMOS transistor.

* * * * *